United States Patent
Culp et al.

(10) Patent No.: US 12,429,414 B2
(45) Date of Patent: Sep. 30, 2025

(54) METHOD FOR MANUFACTURING A DETECTOR

(71) Applicant: Carrier Corporation, Palm Beach Gardens, FL (US)

(72) Inventors: Slade R. Culp, Coventry, CT (US); Wayde R. Schmidt, Pomfret Center, CT (US); David L. Lincoln, Cromwell, CT (US); Dustin D. Caldwell, Portland, CT (US); Peter R. Harris, Jupiter, FL (US)

(73) Assignee: KIDDE FIRE PROTECTION, LLC, Bradenton, FL (US)

( * ) Notice: Subject to any disclaimer, the term of this patent is extended or adjusted under 35 U.S.C. 154(b) by 727 days.

(21) Appl. No.: 17/248,117

(22) Filed: Jan. 11, 2021

(65) Prior Publication Data

US 2021/0239594 A1     Aug. 5, 2021

Related U.S. Application Data

(60) Provisional application No. 62/968,234, filed on Jan. 31, 2020.

(51) Int. Cl.
| | |
|---|---|
| *H05K 1/18* | (2006.01) |
| *G01N 15/0205* | (2024.01) |
| *G01N 15/1434* | (2024.01) |
| *H05K 3/00* | (2006.01) |
| *G01N 15/075* | (2024.01) |

(52) U.S. Cl.
CPC ..... *G01N 15/1434* (2013.01); *G01N 15/0205* (2013.01); *H05K 1/189* (2013.01);
(Continued)

(58) Field of Classification Search
CPC .......... H05K 1/18; H05K 1/181; H05K 1/189; H05K 1/02; H05K 1/0284; H05K 3/00;
(Continued)

(56) References Cited

U.S. PATENT DOCUMENTS 9,209,083 B2    12/2015   Hussain
9,460,600 B2    10/2016   Mittleman et al.
(Continued)

FOREIGN PATENT DOCUMENTS

CN          101868747 A     10/2010

OTHER PUBLICATIONS

Chinese Office Action for Application No. 202110124581.X, Issued Sep. 20, 2024, 14 Pages.

*Primary Examiner* — Tuan T Dinh
(74) *Attorney, Agent, or Firm* — CANTOR COLBURN LLP

(57) ABSTRACT

A method for manufacturing a detector for sensing, detecting and monitoring environmental hazards and conditions, said method including the printing of an electronic circuit on at least a first side of a flexible, printable substrate; coupling at least two electronic components to the electronic circuit on at least the first side of the flexible, printable substrate; thermoforming the flexible, printable substrate to form at least one detection zone from: (i) at least one side of the flexible, printable substrate having an angle for emitting one of a light or a signal from at least one electronic component; and (ii); at least one side of the flexible, printable substrate having an angle for receiving one of a light or a signal by at least one electronic component; and encapsulating the flexible, printable substrate, forming a detector.

9 Claims, 5 Drawing Sheets

(52) U.S. Cl.
CPC ......... *H05K 3/0014* (2013.01); *G01N 15/075* (2024.01); *H05K 2201/10106* (2013.01); *H05K 2201/10151* (2013.01)

(58) Field of Classification Search
CPC ...... H05K 3/0014; H05K 3/0064; H05K 3/12; G01N 15/14; G01N 15/1434; G01N 15/1456; G01N 15/02; G01N 15/0205; G01N 15/06
USPC .......................... 361/764, 782–784, 795, 803
See application file for complete search history.

(56) References Cited

U.S. PATENT DOCUMENTS

| | | | |
|---|---|---|---|
| 10,339,778 B1 | 7/2019 | Birnkrant et al. | |
| 2003/0005782 A1* | 1/2003 | McDonald | G01L 19/0636 29/595 |
| 2011/0135248 A1* | 6/2011 | Langer | H05K 1/0274 29/829 |
| 2012/0138777 A1* | 6/2012 | Larson | G01J 1/18 250/214.1 |
| 2012/0228756 A1* | 9/2012 | Kolleth | H01L 21/563 257/E23.181 |
| 2015/0260673 A1* | 9/2015 | Seto | G01N 33/0059 73/335.03 |
| 2016/0223398 A1* | 8/2016 | Murata | G01J 1/42 |
| 2018/0070829 A1* | 3/2018 | Iwawaki | A61B 5/681 |
| 2019/0051639 A1 | 2/2019 | Hussain et al. | |
| 2019/0056321 A1* | 2/2019 | Pizzi | G01F 23/26 |
| 2019/0069408 A1 | 2/2019 | Keranen et al. | |
| 2019/0162563 A1* | 5/2019 | Yanagisawa | G01D 5/264 |
| 2019/0170551 A1* | 6/2019 | Tsuchiya | G01F 5/00 |

* cited by examiner

METHOD FOR MANUFACTURING A DETECTOR

CROSS REFERENCE TO A RELATED APPLICATION

The application claims the benefit of U.S. Provisional Application No. 62/968,234 filed Jan. 31, 2020, the contents of which are hereby incorporated in their entirety.

BACKGROUND

The present disclosure relates to a method for manufacturing a detection device, and more particularly to detectors using in-mold electronic circuits and additive manufacturing methods. The present disclosure further relates to a detector for sensing, detecting and monitoring hazards and environmental conditions.

Detectors are used to sense, detect and monitor a variety of hazards and conditions such as smoke, fire, particulates (e.g., microbial particulates, including mold or pollen), air quality, and the presence of gases or volatile organic compounds (VOCs). These detectors typically include a printed circuit board; various component parts including optical devices (e.g., photodiode sensors and light emitting diodes (LED)); and a housing, typically in two or more parts. Assembling a conventional detector requires human intervention such as selecting and positioning parts, testing or other handling, all of which can increase manufacturing costs and lower production efficiency.

In addition, conventional detectors typically have what may be considered a "high" profile, meaning that the detector protrudes in an obvious manner from a ceiling into an occupied space, such as a home or office. In some circumstances, a detector that has a high profile may be less aesthetically pleasing than one that has a low or no-profile. In other instances, a "high" profile detector may be unsuitable for use in small spaces, such as ductwork, because they may impede airflow.

What is needed then is a method for manufacturing a detector that, by replacing multiple parts with a single part or by combining multiple parts into a single or fewer parts, reduces human intervention, has a reduced profile to be more aesthetically pleasing, and/or a detector device that is useful in small spaces without impeding airflow.

BRIEF DESCRIPTION

According to another non-limiting embodiment method for manufacturing a detector, the method including: printing an electronic circuit on at least a first side of a flexible, printable substrate; coupling at least two electronic components to the electronic circuit on at least the first side of the flexible, printable substrate; thermoforming the flexible, printable substrate to form at least one detection zone from: (i) at least one side of the flexible, printable substrate having an angle for emitting one of a light or a signal from at least one electronic component; and (ii); at least one side of the flexible, printable substrate having an angle for receiving one of a light or a signal by at least one electronic component; encapsulating the flexible, printable substrate, forming a detector.

In addition to one or more of the features described above, or as an alternative, in further embodiments, the method including stacking an additional layer on at least a first side of the flexible, printable substrate with the printed electronic circuit; thermoforming the additional layer and the flexible, printable substrate.

In addition to one or more of the features described above, or as an alternative, in further embodiments, the method including depositing a coating over at least one of the printed electronic circuit and the detector device.

In addition to one or more of the features described above, or as an alternative, in further embodiments, the method wherein at least one electronic component for emitting light, is a light emitting diode and at least one electronic component for receiving light is a photodiode.

In addition to one or more of the features described above, or as an alternative, in further embodiments, the method wherein the additional layer is a polymer film.

In addition to one or more of the features described above, or as an alternative, in further embodiments, the method wherein the additional layer is a polycarbonate film.

In addition to one or more of the features described above, or as an alternative, in further embodiments, the method wherein the flexible, printable substrate is encapsulated, in whole or in part.

In addition to one or more of the features described above, or as an alternative, in further embodiments, the method wherein the flexible, printable substrate is encapsulated by one or more of thermoforming, injection molding, additive printing.

In addition to one or more of the features described above, or as an alternative, in further embodiments, the method wherein the emitting angle is 180 degrees or less.

In addition to one or more of the features described above, or as an alternative, in further embodiments, the method wherein the receiving angle is 180 degrees or less.

In addition to one or more of the features described above, or as an alternative, in further embodiments, the method wherein the mold has at least one cavity for receiving an electronic component, wherein the electronic component emits or receives the light or the signal, at an angle of 180 degrees or less.

In addition to one or more of the features described above, or as an alternative, in further embodiments, the method further the flexible, printable substrate having an optical guide for: (i) directing the emitted light or signal from the at least one electronic component to a detectable space; and (ii) receiving the light signal by at least one electronic component.

According to another non-limiting embodiment a detector system including: an electronic circuit printed on a flexible, printable substrate, wherein the electronic circuit conforms to a shape forming at least one detection zone; a detector body wherein the conformed electronic circuit is encapsulated, forming a detector.

In addition to one or more of the features described above, or as an alternative, in further embodiments, the system wherein the electronic circuit is conformed to a shape for forming at least one detection zone, by a thermoforming process.

In addition to one or more of the features described above, or as an alternative, in further embodiments, the system wherein the conformed electronic circuit is encapsulated in whole or in part, in a manufacturing process.

In addition to one or more of the features described above, or as an alternative, in further embodiments, the system wherein the manufacturing process is at least one of an additive printing, multi-shot or insert injection molding process.

According to another non-limiting embodiment a detector device including an electronic circuit printed on a flexible, printable substrate; wherein: (i) at least one electronic component of the electronic circuit conforms to an angle for emitting light; and (ii) at least one electronic component of the electronic circuit conforms to at an angle for receiving reflected light; a detector body member, formed to be integral with the conformed electronic circuit.

In addition to one or more of the features described above, or as an alternative, in further embodiments a detector device further including depositing a coating over at least one of the conformed electronic circuit and the detector device.

In addition to one or more of the features described above, or as an alternative, in further embodiments, the detector device wherein at least one electronic component is a light emitting diode.

In addition to one or more of the features described above, or as an alternative, in further embodiments, the detector device wherein the at least one electronic component is a photodiode.

In addition to one or more of the features described above, or as an alternative, in further embodiments, the detector device wherein the angle of an electronic component for emitting light, is 180 degrees or less.

In addition to one or more of the features described above, or as an alternative, in further embodiments, the detector device wherein the angle of an electronic component for receiving reflected light, is 180 degrees or less.

BRIEF DESCRIPTION OF THE DRAWINGS

The accompanying drawings form a part of the specification. Throughout the drawings, like reference numbers identify like elements.

The detailed description explains embodiments of the present disclosure, together with advantages and features, by way of example with reference to the drawings.

DETAILED DESCRIPTION

As further described below, FIGS. 1-4B disclose a detector having a printed electronic circuit on a flexible substrate, conformed to have at least one detection zone for sensing, detecting and monitoring hazards and environmental conditions. In some embodiments, a detector body member may be formed to be integral with the printed electronic circuit, for sensing, detecting and monitoring hazards and environmental conditions. FIG. 5 discloses a method for manufacturing the detector.

Figure 1:
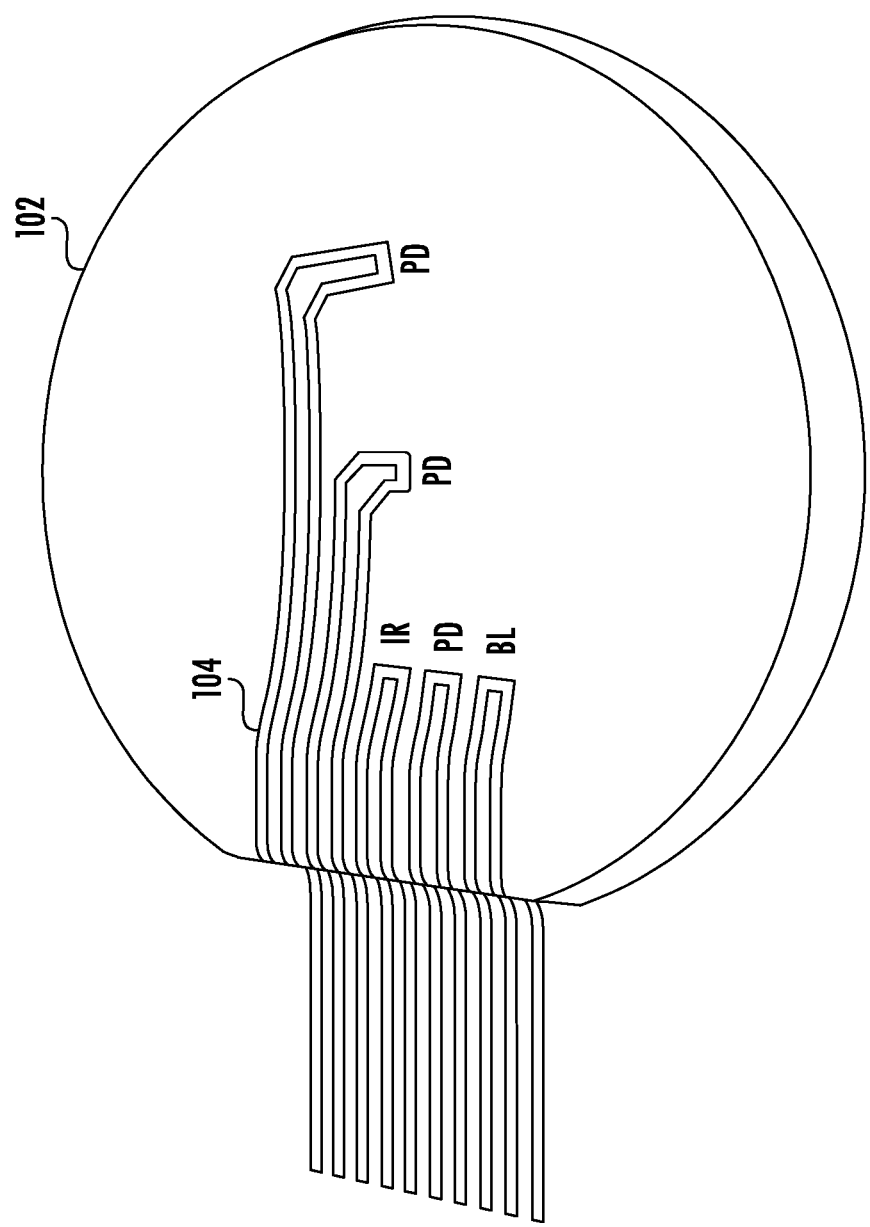
FIG. 1 is a perspective view of a portion of the detector in accordance with embodiments of the disclosure.

Referring to FIG. 1, the printable, flexible substrate 102 is initially substantially flat having no discernable angles and no other characteristics other than as a medium for printing an electronic circuit 104 by a variety of methods. An electronic circuit 104 is printed onto the flat, printable, flexible substrate 102 and in some embodiments, at least one electronic component, is also printed on the printable, flexible substrate 102.

Figure 2:
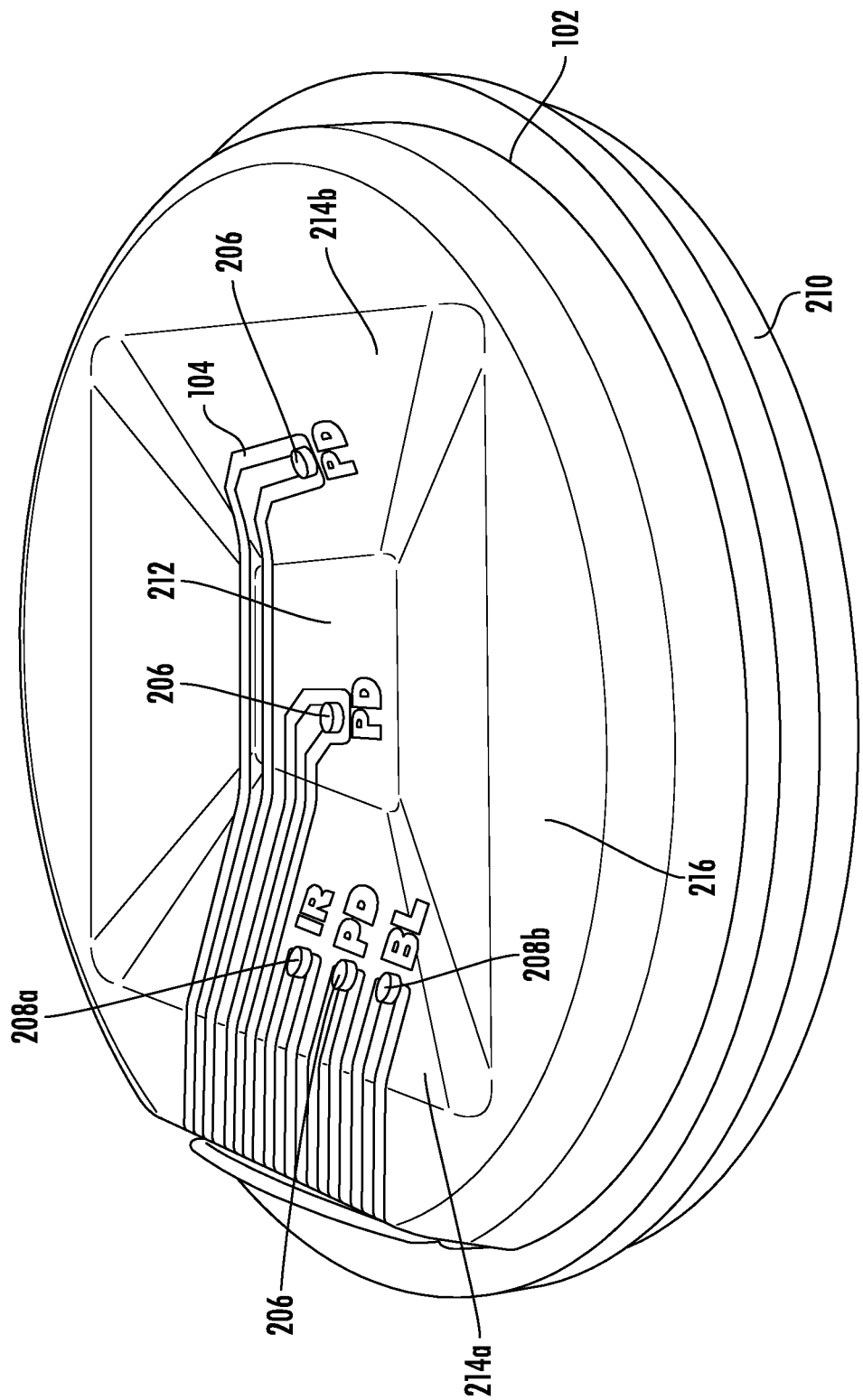
FIG. 2 is a perspective view of a portion of the detector in accordance with embodiments of the disclosure.

Referring to FIG. 2, mold 210 is a form that provides support for the electronic circuit 104 and provides the geometry to the printable, flexible substrate for forming at least one detection zone as discussed below. The mold 210 includes at least one of a surface angle, depression or cavity for forming detection zones on the printable, flexible substrate. By thermoforming the printable, flexible substrate including the electronic circuit 104 to the mold, the electronic circuit 104 conforms to the shape of the mold, forming at least one detection zone for sensing, detecting and monitoring hazards and environmental conditions.

In one non-limiting embodiment, electric circuit 104, which may include a sensor such as photodiode 206 and LED 208a, 208b, are printed on flexible, printable substrate 102, and then the flexible, printable substrate 102 is thermoformed to mold 210. In some embodiments, the electronic circuit 104 is printed, and is then conformed to mold 210 by a manufacturing process such as thermoforming; and then at least one electronic component is added to the electronic circuit 104 by coupling the electronic component to the electronic circuit 104 by hand or by machine, after thermoforming. In an alternate embodiment, at least one electronic component is coupled to the printed electronic circuit, and then the electronic circuit with electronic component is thermoformed to mold 210, conforming the electronic circuit to the shape of the mold 210. Electronic circuit 104 may include a sensor such as photodiode 206 and LED 208a, 208b, and is printed on flexible, printable substrate 102.

In another non-limiting embodiment, electronic circuit 104 is printed, and is then conformed to mold 210 by a manufacturing process such as thermoforming. The printed electronic circuit 104 may then be removed from mold 210 and at least one electronic component is added to the electronic circuit 104 by coupling the electronic component to the electronic circuit 104 by hand or by machine, after thermoforming. In this embodiment, the printable, flexible substrate 102, and/or any optional addition film(s), deposition(s), or painting(s) discussed below, are sufficiently rigid to permit the coupling of the electronic component to the printable, flexible substrate 102 without any additional underlying support.

In another non-limiting embodiment, following the printing of electronic circuit 104 and coupling of at least one electronic circuit to the electronic circuit 104, and the addition of any optional film(s) or coating(s), the printed electronic circuit 104 may be integrated with a component such as a base (not shown). A base, which may be formed by an additive printing, multi-shot or insert injection molding process, may provide structure or shape to the detector device and/or may provide support for detector components, such as a connector, or communication or memory devices. A film, discussed below, may be stacked on the electronic circuit 104, and then both the film and the electronic circuit 104, may be conformed through thermoforming or other similar process to form at least one detection zone.

The flexible, printable substrate 102 may comprise a variety of suitable substances including but not limited to polycarbonate (PC), polyethylene terephthalate (PET), polypropylene (PP), polyvinyl chloride (PVC) and other substrates that allow for uniformity, high resolution, accuracy and that have low or no deformation when applying stressors such as pressure, temperature or force (e.g., stretching). The substrate may include coatings or additives to control scratch resistance, dust and moisture accumulation and passive optical filtering.

A single or multilayer film may be stacked over an electronic circuit 104, and may be transparent, clear, semi-transparent or opaque. For example, the film may be a polycarbonate single layer film for protecting sensors, such as optical devices, from interference from dust or insects. The film may also be useful for measuring reflected light between the flexible, printable substrate 102 and the film, as a means for detecting the presence of dust or moisture accumulation on electronic components. The film may also magnify or minimize the input or output of a sensor. Alternatively, one or more devices (e.g., a lens, apertures) may be positioned between the flexible, printable substrate and the film to magnify or minimize the input or output of one or more sensors, or to modify sensor sensitivity or focus. In another non-limiting embodiment, one or more lenses or apertures may be incorporated into the detector body (FIG. 4A, 400) for the same or similar purpose.

In one non-limiting embodiment, at least one coating may be deposited over one or both sides of electronic circuit 104. The coating may aid in protecting the electronic circuit 104 any additional elements or component parts, or may be deposited to add characteristics, features, or texture to the detector. The coating may include, but is not limited to paint, resin, plastic, polycarbonate film, or laminate (e.g., combining different plastic and composite materials). One or more coatings may be applied at any point after forming the electronic circuit 104, including after thermoforming the electronic circuit 104 to mold 210, after removing electronic circuit 104 from mold 210, after overlaying optional film over the electronic circuit 104, after integrating the electronic circuit 104 with a detector body (FIG. 4, 402) (with or without an optional base). In some embodiments, other components or elements may be added during the coating deposition process. For example, a coating may be applied over the electronic circuit 104 to protect optical devices. Then, wiring or processing components may be added to detector followed by another coating to secure the wiring or components in place.

An electronic circuit 104 may be printed on flexible, printable substrate 102, by a variety of methods, including non-impact printing (e.g., ink jet printing and thermography printing), impact printing (e.g., screen printing, flexography, lithography, pad, gravure printing) and direct write printing (e.g., nScrypt). Inks useful for printing electronic circuit 104, semiconductors and interconnecting components such as LED 208a, 208b, and photodiode 206, may include any one or more inks by way of example, silver-based or copper-based inks, metal nanoparticle inks, carbon-based inks, and organometallic inks.

A printed electronic circuit 104 may include components such as integrated circuits, conductors, transducers, optical devices, sensors, audio devices (e.g., speaker or sounder), devices for supplying power, microcontrollers, microprocessors and memory (volatile and/or non-volatile), components for one-way or two-way wired or wireless communication (e.g., transmitter/receiver, antennae, RFID technology). In some embodiments, in addition to sensing and detecting capabilities, electronic circuit 104 may also include components that allow a detector (FIG. 4A, 400) to communicate and share information with other detectors and other fire system components, or with one or more of a control panel, a computer (e.g., desktop computer, laptop computer or tablet) or a portable electronic device (e.g., smart phone, tablet, watch) or a central server or cloud computing system or device that is network connected anywhere in the world. Data communications can be carried out using any of a variety of custom or standard wired or wireless protocols for commercial or residential use (Wi-Fi, ZigBee, 6LoWPAN, CAT6 Ethernet, HomePlug, etc.).

Referring to FIG. 2, electronic circuit 104 on flexible, printable substrate 102, may include optical devices such as light emitting diodes (LED) 208a, 208b, which may emit different wavelengths of visible or non-visible light useful for detecting various hazards and conditions, such as blue light 208a or infrared light 208b. Electronic circuit 104 may also include one or more detection sensors such as photodiode (PD) 206 (e.g., sensing ambient light, ultraviolet (UV) light). Electronic circuit 104 may also include accelerometers (e.g., vibration, seismic sensing), or sensors for detecting explosive gases such as propane, hydrogen or methane, or sensors for detecting motion (e.g., infrared motion sensor).

Figure 3:
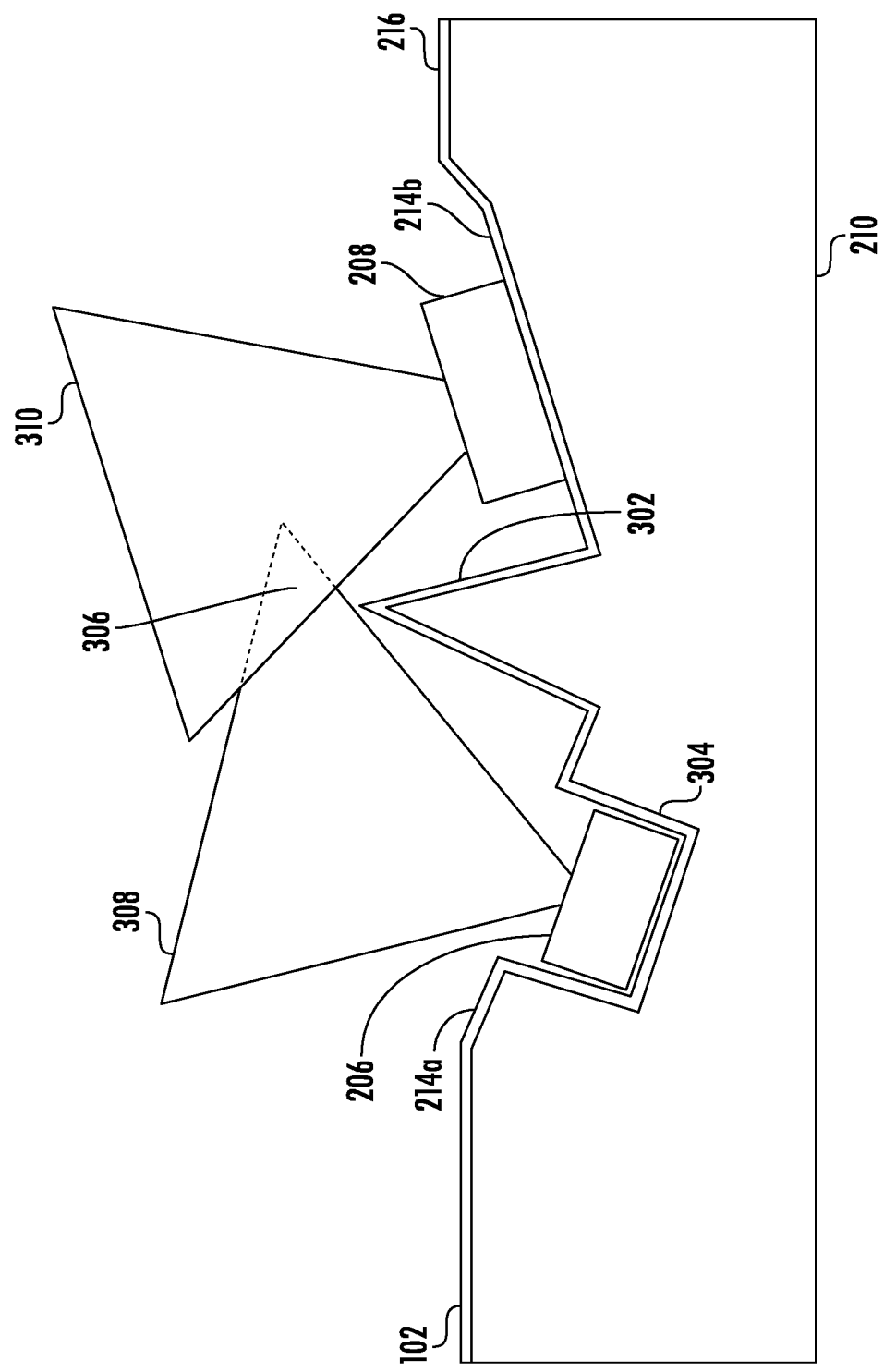
FIG. 3 is a side view of a portion of the detector in accordance with embodiments of the disclosure.

A sensor may be located anywhere on the flexible, printable substrate 102. For example, a photodiode 206 may be in a depression 212, or on slopes 214a, 214b or in a cavity (FIG. 3, 304). In another example, a sensor such as LEDs 208a, 208b may be located anywhere on flexible, printable substrate, such as slope 214a to serve as an indicator of operational status (e.g., on/off, alarm state, service required), provided the LED indicator does not disrupt (e.g. avoids or enhances) particle detection.

Turning to FIG. 3, when one or more optical devices are active, a light 308, 310 emanates from, or is received by an optical device, at an angle consistent with the location and placement of the optical device on the flexible, printable substrate 102, and based on other a factors, such as the absence or presence of one or more optical guides 302. Light 308 and light 310 are each generally depicted as a cone of light for illustrative purposes only. A detectable particle or specie is detected when it is within a detection zone 306, formed at the intersection of light 308, 310. For example, when light 310 from LED 208 intersects with the surface of a detectable particle or specie, some light 308 is reflected from the surface and is received by photodiode 206.

A detection zone 306 may enable a processor, such as a microprocessor, microcontroller, or other suitable device, to differentiate between various particle sizes by comparing the intensity of forward- and back-scattered light. Specifically, comparing first the ratios of the intensity of light forward-scattered from particles at an angle of less than ninety (90) degrees from the original direction of the light at LED 208, to second, light backward-scattered at an angle greater than ninety (90) degrees from the original direction of light at LED 208. To further differentiate particle species multiple optical wavelengths and detection zones can be employed, which enables greater specificity of particle discrimination and/or variety of types of particles detected. It should be appreciated that multiple detection zones for detecting various environmental conditions, indoor pollutants, explosive gases and open flame may be formed using, for example, multiple sensing and detecting electronic components. In another non-limiting embodiment one or more LEDs 208 may serve as an indicator of operational status (e.g., on/off, alarm state, service required), provided the LED indicator 208 does not disrupt (e.g. avoids or enhances) operation of a sensor LED 208. In one example, referring to FIG. 2, the flexible, printable substrate 102 may have two or more slopes 214a, 214b directed inwardly from a topside 216 to a depression forming floor 212. In another example, a photodiode 206, an LED 208a emitting infrared light (IR) and LED 208b emitting blue light (BL) may be positioned on slope 214a. In yet another example, photodiode 206 may be positioned on slope 214b for detecting reflected light 208 from a particle (not shown). In another non-limiting embodiment, one or more photodiodes 206 may be positioned on floor 212, as an additional sensor.

Mold 210 may have at least one cavity 304 for receiving an electronic component, such as photodiode 206, when conforming the flexible, printable substrate 102 to mold 210 during a manufacturing process such as thermoforming. It may be appreciated that any one or more photodiodes 206 or LEDs 208 may be received into one or more cavities (see, 304, and FIG. 4B, 304a, 304b, 304c) in mold 210, during thermoforming. For example, the thermoforming process fixes an electronic component, such as photodiode 206 in place, and at an angle suitable for detecting reflected light 308 from a particle. Alternatively, mold 210 may have at least one cavity 304 such that substrate 102 includes cavity 204 following conforming the flexible, printable substrate 102 to mold 210 during a manufacturing process such as thermoforming, and an electronic component, such as photodiode 206, may be added to substrate 102 after thermoforming.

In one non-limiting embodiment, an optical guide 302 may be formed on the flexible printable substrate 102 using one or more processes such thermoforming, as multi-shot, insert injection molding or additive printing, which processes may be performed either before or after thermoforming the flexible, printable substrate 102, to mold 210 . . . . An optical guide, or optical wave guide, is a structure used for spatially confining and directing light into an intended target. By way of example and not limitation, optical guide 302 can be used to direct reflected light 308 into photodiode 206, or direct emitted light 310 from LED 208 to a space requiring detection. Optical guide 302 may direct light 308, 310 to form at least one detection zone 306 for detecting at least one particle specie, environmental condition or indoor pollutant.

In one non-limiting embodiment, photodiode 206 is partially shielded by optical guide 302 to prevent photodiode 206 from receiving all of emitted light 310 from LED 208. For example, optical guide 302 rejects light that may be reflected from interior surfaces of the detector thereby avoiding interference of interior-reflected light. In some embodiments one or more optical guides 302 may also be present on the exterior surface of detector body (FIG. 4A, 402) to direct light or to control interference from ambient light.

The generally triangular shape, orientation, and placement of optical guide 302 shown in FIG. 3 is illustrative only, in practice optical guide 302 may have any shape, and may have any orientation or location on the flexible, printable substrate 102 where an optical guide 302 may be necessary for reliable operation of the detector 400, i.e., to block or direct light as needed to prevent interference and/or enhance detection.

Figure 4A:
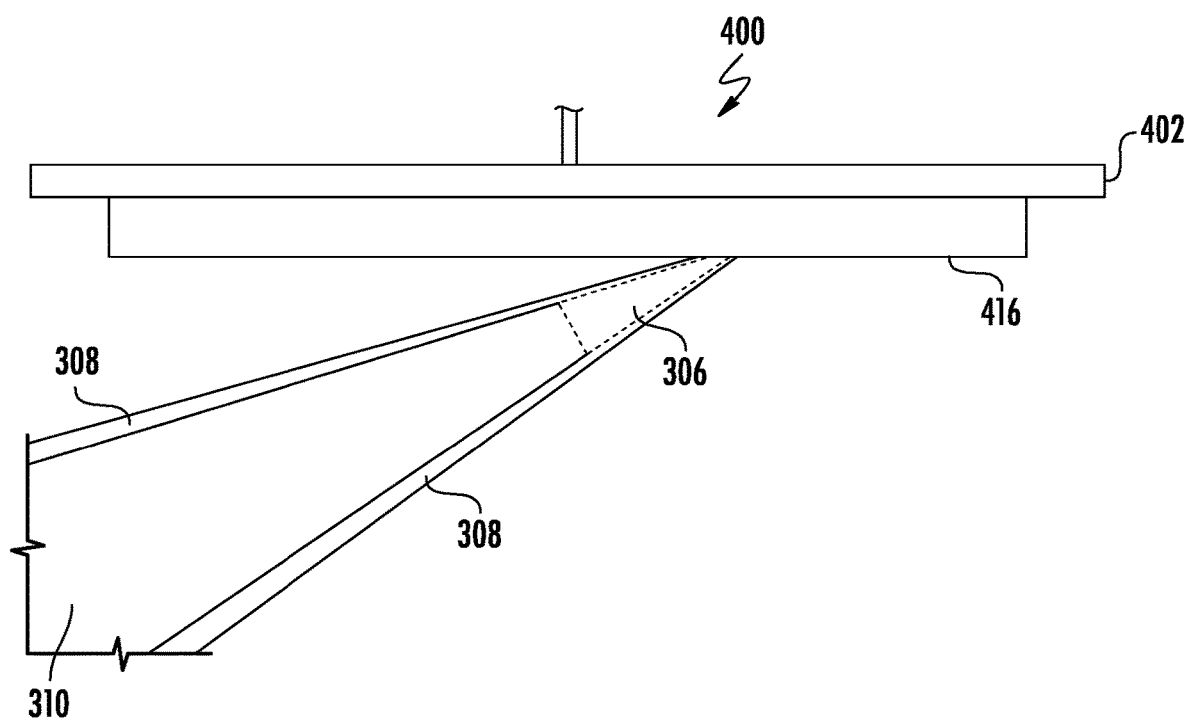
FIG. 4A is a side view of a portion of the detector in accordance with embodiments of the disclosure.
Figure 5:
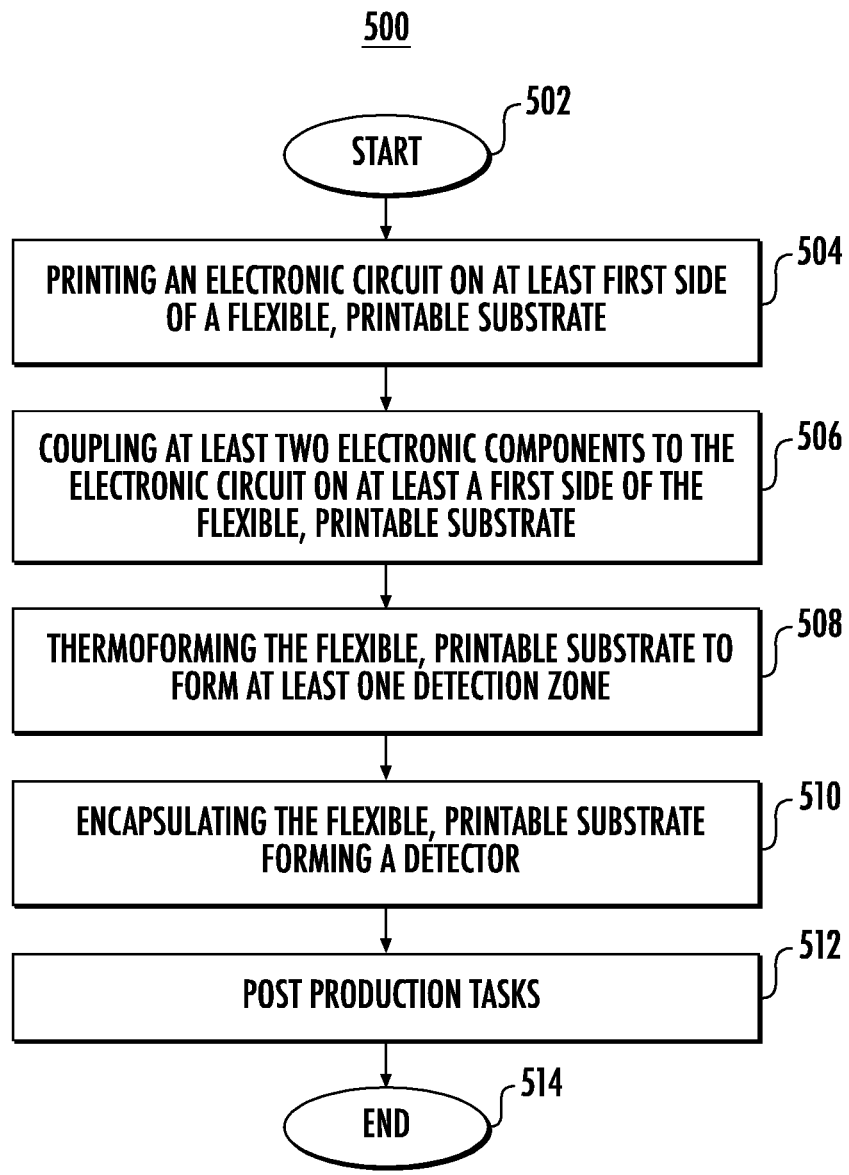
FIG. 5 illustrates a flow diagram of a method for manufacturing a detector in accordance with embodiments of the disclosure.

Turning to FIG. 4A, a side view of a detector 400 is shown. Detector 400 may sense or detect various environmental conditions and indoor pollutants (e.g., biological, chemical and particles) using emitted and received signals or light. Detectable environmental conditions may include temperature, heat and humidity; presence of biological pollutants such as bacteria, viruses, mold, fungi, dust mites, animal dander, and pollen; and presence of chemical pollutants such as cleaners, solvents, fuels, propane, methane, carbon monoxide, carbon dioxide, formaldehyde, nitrogen dioxide and other VOCs. Detectable particles may include dust, smoke, dirt, or other particles capable of dispersion such as water (e.g., mist), or oil.

Detector body 402 may be formed using one or more processes such as injection molding, stamping, or additive printing. Detector body 402 encapsulates, in whole or in part, the flexible, printable substrate (FIG. 2, 102), electronic circuit (FIG. 2, 104), photodiode (FIG. 2, 206) and LED (FIG. 2, 208), and optionally a base providing structure (not shown). The detector body 402 or base may be formed to have one or more internal baffles, spaces or chambers (not shown) within the detector body 402 or one or more holes or openings (not shown) along the surface of detector body 402. Baffles or internal chambers may be useful in detecting certain environmental conditions or hazards, by way of example and not limitation, heat, or smoke or other particulates of a specific targeted size and/or of light having specific wavelength characteristics.

Turning to FIG. 4A, detector 400 having a surface 416 oriented toward the space to be detected, is shown. FIG. 4A illustrates an example of light 310, emitted from at least one LED within detector body 402. Also illustrated is light 308 which is generally reflected back to a photodiode within detector body 402, from objects in the space to be detected. A detection zone 306 is formed where light 308, 310 and a detectable particle or specie, intersect.

Figure 4B:
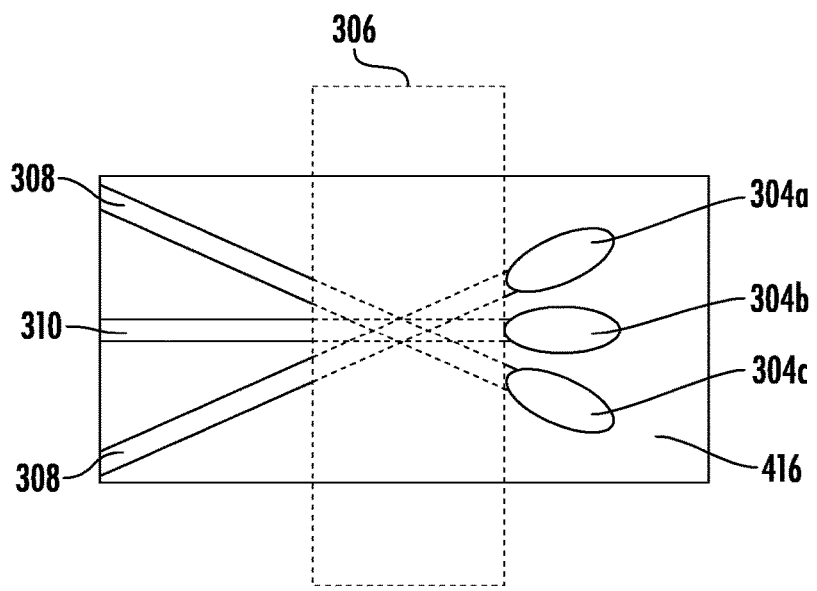
FIG. 4B is a topside view of a portion of the detector in accordance with embodiments of the disclosure.

Turning now to FIG. 4B, a portion of surface 416 of the detector is shown. In one non-limiting embodiment, a surface 416 of a detector has through-holes or openings for permitting light to enter and exit the detector. The openings may have any shape or orientation that allow the forming of at least one detection zone 306. In one non-limiting embodiment, light 310 from an LED in cavity 304b, passes through an opening to reach a space to be detected. Similarly, light 308 reflected from a detectable particle or specie within detection zone 306, passes through at least one opening to be detected by at least one photodiode within a cavity 304a, 304c.

In one non-limiting embodiment, a method for manufacturing a detector, includes printing an electronic circuit on at least a first side of a flexible, printable substrate; coupling at least two electronic components to the electronic circuit on at least the first side of the flexible, printable substrate; thermoforming the flexible, printable substrate to form at least one detection zone from: (i) at least one side of the flexible, printable substrate having an angle for emitting one of a light or a signal from at least one electronic component; and (ii); at least one side of the flexible, printable substrate having an angle for receiving one of a light or a signal by at least one electronic component; and, in some embodiments encapsulating the flexible, printable substrate, forming a detector.

FIG. 5 shows a flow diagram disclosing an embodiment of a method for manufacturing a detector. At the beginning of the method for manufacturing, a start-up phase 502 may be executed. During start up 502, the necessary tasks such as material, electronic components, equipment and tools selection, acquisition, calibration and other configuration may take place. The equipment such as printers used for printing an electronic circuit, thermoforming, electronics assembly, if needed, may be ramped up to operational status at this stage or later.

At least one flexible, printable substrate is obtained on which to print an electronic circuit. At 504, an electronic circuit is printed on the flexible, printable substrate as contemplated in one or more of the disclosed embodiments. In some embodiments, one or more electronic components such as a photodiode and/or an LED, are also printed.

However, in one non-limiting embodiment, at least two electronic components are coupled to the electronic circuit by hand or by machine in step 506. The electronic circuit may be printed onto one or both sides of the flexible, printable substrate. In addition, electronic components may be printed or placed on one or both sides of the flexible, printable substrate.

In the next step, 508, the flexible, printable substrate with electronic circuit is prepared for a thermoforming process. Preparing the electronic circuit for thermoforming may include coupling electronic components, and/or stacking a film over the electronic circuit (with or without any added electronic components). Once the electronic circuit is prepared the electronic circuit and flexible, printable substrate are conformed to the mold by a thermoforming process.

In a separate manufacturing process, 510, the conformed electronic circuit is encapsulated in whole or in part, forming a detector in accordance with disclosed embodiments.

In some embodiments, the conformed electronic circuit is coupled to an optional base. As discussed above, the optional base (which may be formed in a separate manufacturing process) may provide support for detector components, such as a connector, or communication or memory devices structure, and provide shape to the detector device. In this example, the optional base is formed, then conformed electronic circuit and base may be encapsulated in a detector body in accordance with the disclosed embodiments.

Potential post manufacturing tasks 512 may include adding characteristics, features, or texture to the detector, by depositing one or more coatings. As discussed above, at least one coating maybe deposited over: the electronic circuit following thermoforming, and/or the detector if the electronic circuit is encapsulated (with or without optional base). For example, one or more layers of protective, indicative, tactile and/or aesthetic value (graphics, colors, figures, text, numeric data, surface profile, etc.) may be added to the detector. Other materials such as wiring, rubber materials, and/or plastics may be added between coating layers. In addition, other elements may be added to the detector, for example, electrical connectors or wiring may be installed, or exterior lenses or apertures may be added to the exterior, or capacitive sensors or materials that hold an electric charge that may useful for touch-screen applications. Shaping or cutting may also take place.

The method execution is ended at 514. It should be appreciated that the order of the steps disclosed above may be altered depending on manufacturing variables such as material flexibility, and configuration variations such as layout and component differences. In addition, the other steps of the manufacturing method may be introduced at any point in the processes that result in a detector. Further, any one or more steps of the method may be repeated. For example, the method may include a laminating step, or may include more than one thermoforming step. By way of example and not limitation, the method may include printing an electronic circuit on a flexible, printable substrate. The printed electronic circuit may thereafter be laminated. The laminating step may preserve the integrity of the printed circuit as it continues through the manufacturing process. The method may then include coupling at least two electronic components to the circuit on one or both sides of the flexible, printable substrate, followed by at least one thermoforming step to shape the electronic circuit. In an alternate method, the electronic circuit may be printed, then a laminating step may follow. Thereafter, one or more electronic components may be coupled to the electronic circuit, by hand and/or machine, following by a second laminating and/or thermoforming process.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

We claim:

1. A method for manufacturing a detector, the method comprising:
   printing an electronic circuit on at least a first side of a flexible, printable substrate;
   coupling a first electronic component and a second electronic component to the electronic circuit on at least the first side of the flexible, printable substrate;
   thermoforming the flexible, printable substrate to form at least one detection zone from:
   (i) at least one side of the flexible, printable substrate having an angle for emitting light from the first electronic component; and
   (ii) at least one side of the flexible, printable substrate having an angle for receiving light by the second electronic component;
   wherein the first electronic component is a light emitter and the second electronic component is a light receiver, the second electronic component configured to receive light from the first electronic component scattered by particles in the at least one detection zone;
   wherein the light emitter is positioned on a first sloped surface and the light receiver is positioned on a second sloped surface, the first sloped surface positioned at an angle relative to the second sloped surface, the angle being greater than zero degrees.

2. The method of claim 1 wherein the first electronic component is a light emitting diode the second electronic component is a photodiode.

3. The method of claim 1 wherein at least one of the flexible, printable substrate and base is encapsulated, in whole or in part.

4. The method of claim 1 wherein at least one of the emitting angle and the receiving angle are 180 degrees or less.

5. The method of claim 1 wherein the flexible, printable substrate has at least one cavity for receiving an electronic component, wherein the electronic component emits or receives the light, at an angle of 180 degrees or less.

6. The method of claim 1 further comprising the flexible, printable substrate having an optical guide for: (i) directing the emitted light from the first electronic component to the at least one detection zone; and (ii) receiving the light by the second electronic component, the optical guide comprising a raised surface extending between the first electronic component and the second electronic component.

7. The method of claim 1 wherein the first sloped surface and the second sloped surface form at least part of a depression in the flexible, printable substrate.

8. The method of claim 2 wherein the additional layer is at least one of: a polymer film and a polycarbonate film.

9. The method of claim 3, wherein at least one of the flexible, printable substrate and base is encapsulated by one or more of thermoforming, injection molding, additive printing.

\* \* \* \* \*